US008980655B2

(12) United States Patent
Okada et al.

(10) Patent No.: US 8,980,655 B2
(45) Date of Patent: Mar. 17, 2015

(54) TEST APPARATUS AND TEST METHOD

(71) Applicant: Mitsubishi Electric Corporation, Tokyo (JP)

(72) Inventors: Akira Okada, Tokyo (JP); Takaya Noguchi, Tokyo (JP); Norihiro Takesako, Tokyo (JP); Kinya Yamashita, Tokyo (JP); Hajime Akiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/256,276

(22) Filed: Apr. 18, 2014

(65) Prior Publication Data

US 2015/0044788 A1 Feb. 12, 2015

(30) Foreign Application Priority Data

Aug. 8, 2013 (JP) .................................. 2013-165108

(51) Int. Cl.
*H01L 21/00* (2006.01)
*H01L 21/66* (2006.01)
*G01R 31/28* (2006.01)
*H01L 21/02* (2006.01)

(52) U.S. Cl.
CPC ............ *H01L 22/12* (2013.01); *G01R 31/2893* (2013.01); *G01R 31/2898* (2013.01); *H01L 21/02076* (2013.01)
USPC ..... 438/18; 324/754.07; 15/210.1; 15/104.93

(58) Field of Classification Search
CPC .................... H01L 21/02021; H01L 21/02008
USPC ................ 438/10, 18; 451/58; 324/754.03, 324/754.07; 14/210.1, 104.93; 134/7
See application file for complete search history.

(56) References Cited

U.S. PATENT DOCUMENTS

| 5,967,882 | A  | * | 10/1999 | Duescher ........................ 451/57 |
| 6,322,433 | B1 | * | 11/2001 | Matsumura .................... 451/415 |
| 2001/0041516 | A1 | * | 11/2001 | Hembree ........................ 451/50 |
| 2002/0031983 | A1 | * | 3/2002 | Nakagawa et al. ............. 451/28 |
| 2008/0242105 | A1 |   | 10/2008 | Kai et al. |
| 2010/0184296 | A1 |   | 7/2010 | Nambu et al. |

FOREIGN PATENT DOCUMENTS

| JP | S58-182826 A | 10/1983 |
| JP | H04-206848 A | 7/1992 |
| JP | H07-094563 A | 4/1995 |
| JP | H07-159487 A | 6/1995 |
| JP | H10-261605 A | 9/1998 |
| JP | 2007-115979 A | 5/2007 |

(Continued)

*Primary Examiner* — Caridad Everhart
(74) *Attorney, Agent, or Firm* — Studebaker & Brackett PC (57) ABSTRACT

A test apparatus includes a foreign matter removal unit having a first slope provided with an abrasive coating or an adhesive sheet and a second slope provided with an abrasive coating or an adhesive sheet, the second slope facing the first slope in such a manner that an upper end of the second slope is spaced from an upper end of the first slope a greater distance than a lower end of the second slope is spaced from a lower end of the first slope, a test unit for testing electrical characteristics of a semiconductor chip, and a transfer unit for holding and releasing the semiconductor chip at a position above the first and second slopes and transferring the semiconductor chip to the test unit.

20 Claims, 6 Drawing Sheets (56) References Cited

FOREIGN PATENT DOCUMENTS

| JP | 2007-163159 A | 6/2007 |
| JP | 2008-141135 A | 6/2008 |
| JP | 2008-244099 A | 10/2008 |
| JP | 2010-161211 A | 7/2010 |
| JP | 2010-165943 A | 7/2010 |
| JP | 2010-245332 A | 10/2010 |

* cited by examiner

TEST APPARATUS AND TEST METHOD

BACKGROUND OF THE INVENTION

1. Field of the Invention

The present invention relates to a test apparatus and a test method for testing electrical characteristics of a semiconductor chip after removing foreign matter from it.

2. Background Art

Japanese Laid-Open Patent Publication No. 2010-165943 discloses a technique for removing foreign matter adhering to a semiconductor wafer by blowing purge gas against the wafer. Japanese Laid-Open Patent Publication No. 2008-141135 discloses a technique for reducing the occurrence of foreign matter resulting from dicing a semiconductor wafer. In this technique, the metal electrodes on the semiconductor wafer are formed and processed so as not to cover the dicing lines, thereby minimizing the occurrence of foreign matter resulting from dicing.

It has been found in some cases that semiconductor chips have foreign matter adhering to sides thereof after they have been produced by dicing a wafer. If a semiconductor chip with such foreign matter is tested for electrical characteristics, the test results will be affected by the foreign matter, degrading the reliability of the test. Therefore, it is necessary to remove foreign matter (if any) from a semiconductor chip before testing its electrical characteristics.

However, it is difficult to remove foreign matter from a semiconductor chip (or wafer) merely by blowing purge gas against the chip, as in the technique disclosed in the above Patent Publication No. 2010-165943. Further, the technique disclosed in the above Patent Publication No. 2008-141135 requires the step of removing portions of the metal electrodes on the wafer so as to expose the dicing lines, resulting in increased manufacturing cost.

SUMMARY OF THE INVENTION

The present invention has been made to solve the above problems. It is, therefore, an object of the present invention to provide a test apparatus and a test method capable of reliably testing a semiconductor chip by removing foreign matter from the chip beforehand using a simple method.

The features and advantages of the present invention may be summarized as follows.

According to one aspect of the present invention, a test apparatus includes a foreign matter removal unit having a first slope provided with an abrasive coating or an adhesive sheet and a second slope provided with an abrasive coating or an adhesive sheet, the second slope facing the first slope in such a manner that an upper end of the second slope is spaced from an upper end of the first slope a greater distance than a lower end of the second slope is spaced from a lower end of the first slope, a test unit for testing electrical characteristics of a semiconductor chip, and a transfer unit for holding and releasing the semiconductor chip at a position above the first and second slopes and transferring the semiconductor chip to the test unit.

According to another aspect of the present invention, a test method includes removing foreign matter from sides of a diced semiconductor chip by bringing the sides of the semiconductor chip into contact with slopes having an abrasive coating or an adhesive sheet thereon, and testing electrical characteristics of the semiconductor chip after the foreign matter removal step.

Other and further objects, features and advantages of the invention will appear more fully from the following description.

DETAILED DESCRIPTION OF THE PREFERRED EMBODIMENTS

Test apparatuses and test methods in accordance with embodiments of the present invention will be described with reference to the accompanying drawings. Throughout the specification the same or corresponding components are designated by the same reference numerals and may be described only once.

First Embodiment

Figure 1:
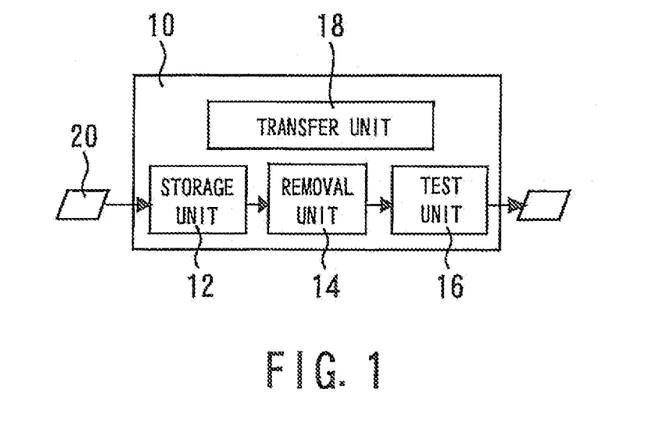
FIG. 1 is a block diagram of a test apparatus in accordance with a first embodiment of the present invention.

FIG. 1 is a block diagram of a test apparatus 10 in accordance with a first embodiment of the present invention. The test apparatus 10 includes a temporary storage unit 12 for temporarily stores a diced semiconductor chip 20. A foreign matter removal unit 14 for removing foreign matter from the semiconductor chip 20 is provided adjacent the temporary storage unit 12. A test unit 16 for testing electrical characteristics of the semiconductor chip 20 is provided adjacent the opposite side of the foreign matter removal unit 14 from the temporary storage unit 12. The test apparatus 10 further includes a transfer unit 18 for transferring the semiconductor chip 20 from the temporary storage unit 12 to the foreign matter removal unit 14 and then from the foreign matter removal unit 14 to the test unit 16.

Figure 2:
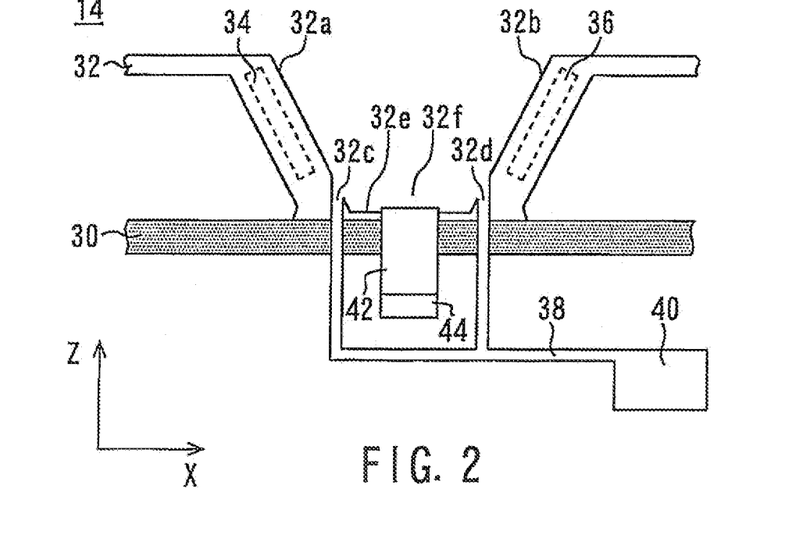
FIG. 2 is an elevational view of the foreign matter removal unit.

FIG. 2 is an elevational view of the foreign matter removal unit 14. The foreign matter removal unit 14 has a substrate 30. A body member 32 is mounted on the substrate 30. The body member 32 has a first slope 32a and a second slope 32b. The first slope 32a is provided with an abrasive coating or adhesive sheet. The second slope 32b is also provided with an abrasive coating or adhesive sheet. The gain size of these abrasive coatings should preferably be, e.g., approximately

4000 (or finer than that), since large abrasive particles may damage the semiconductor chip 20.

The first slope 32a and the second slope 32b face each other. Their upper ends are spaced a greater distance from each other than their lower ends. A vibrator 34 is embedded under the first slope 32a of the body member 32. A vibrator 36 is embedded under the second slope 32b of the body member 32. In FIG. 2, the vibrators 34 and 36 are indicated by dashed lines.

The vibrators 34 and 36 may be configured of, e.g., a piezoelectric element or an eccentric motor. The vibrators 34 and 36 are used to vibrate the first slope 32a and the second slope 32b, respectively. In order to effectively vibrate the first slope 32a and the second slope 32b, the body member 32 is preferably formed of a rigid material, which does not substantially absorb vibrations.

Figure 3:
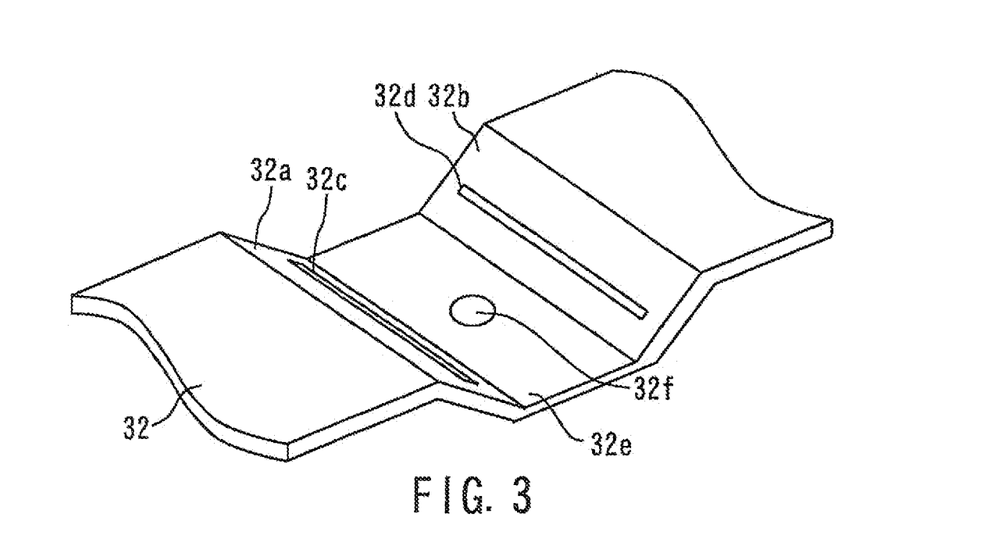
FIG. 3 is a perspective view of the body member of the foreign matter removal unit.

An opening 32c is formed in the first slope 32a of the body member 32. Further, an opening 32d is formed in the second slope 32b of the body member 32. The openings 32c and 32d are used to collect foreign matter which has dropped from the semiconductor chip 20. FIG. 3 is a perspective view of the body member 32 of the foreign matter removal unit 14. The openings 32c and 32d are formed to extend in the transverse direction of the body member 32.

Referring back to FIG. 2, the openings 32c and 32d communicate with a pipe 38. The pipe 38 in turn communicates with a suction device 40 for drawing air from inside the openings 32c and 32d. An opening 32f is formed in the middle portion 32e of the body member 32 between the first slope 32a and the second slope 32b. A lifting member 42 is provided in the opening 32f. A movement control unit 44 is secured to the lifting member 42. The movement control unit 44 is used to move the lifting member 42 in the Z-direction (i.e., the vertical direction) and rotate it about its Z-axis. That is, the lifting member 42 can be moved vertically through the space between the first slope 32a and the second slope 32b.

Figure 4:
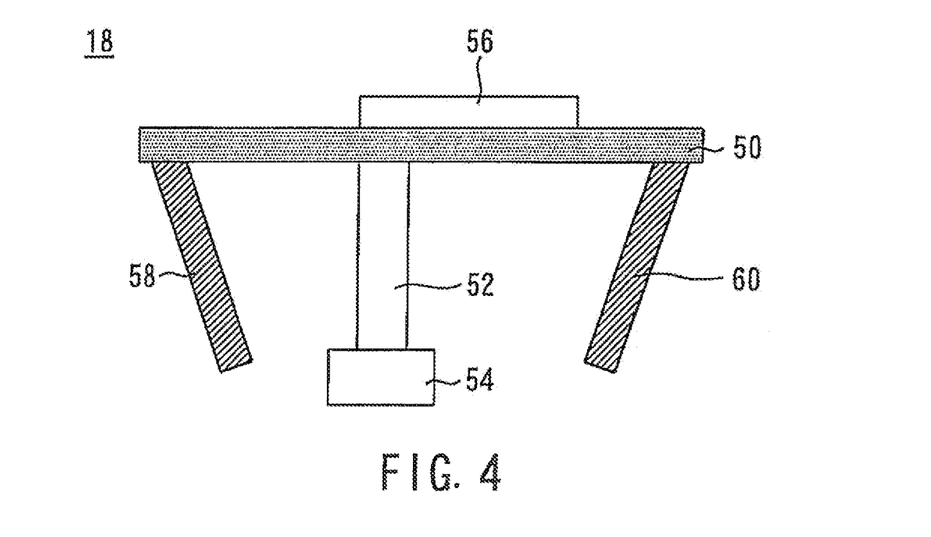
FIG. 4 is an elevational view of the transfer unit.

FIG. 4 is an elevational view of the transfer unit 18. The transfer unit 18 has a substrate 50. A suction member 52 having a cavity therein is secured to the substrate 50. A collet 54 is secured to the tip of the suction member 52. The suction member 52 is connected to a suction device 56. The suction device 56 is used to draw air from inside the suction member 52 so that the semiconductor chip is held to the collet 54 by vacuum.

Charge removal devices 58 and 60 for removing charge from foreign matter on the semiconductor chip are secured to the substrate 50. The charge removal devices 58 and 60 are used to remove charge from charged foreign matter adhering to the semiconductor chip. The charge removal devices 58 and 60 may be configured of, but are not limited to, e.g., an ionizer, a humidifying means, or a heating means.

Figure 5:
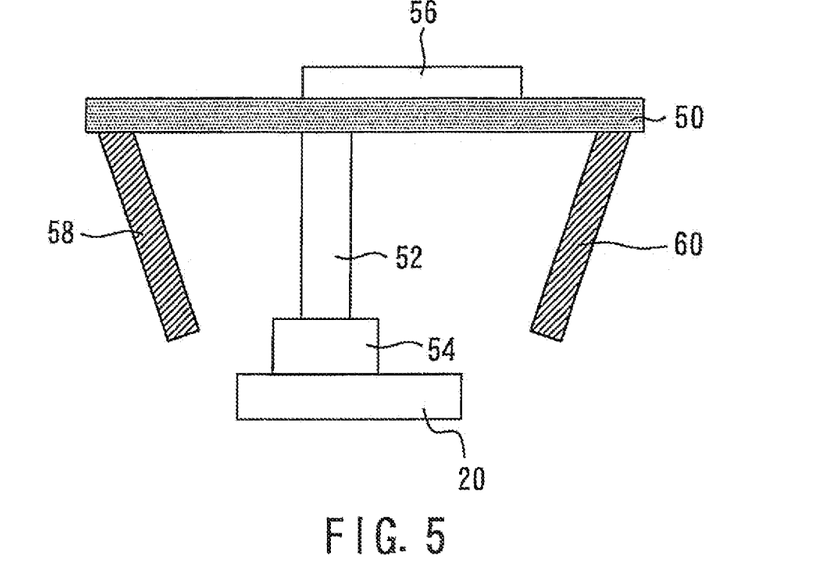
FIG. 5 is an elevational view of the transfer unit after it has picked up the semiconductor chip.

A test method using the test apparatus 10 in accordance with the first embodiment will be described. First, a semiconductor chip 20 initially stored in the temporary storage unit 12 is picked up by the transfer unit 18. The semiconductor chip 20 is one of the semiconductor chips produced by dicing a wafer and has a rectangular shape, as viewed in plan. FIG. 5 is an elevational view of the transfer unit 18 after it has picked up the semiconductor chip 20. After the semiconductor chip 20 has been picked up by the transfer unit 18, the charge removal devices 58 and 60 of the transfer unit 18 are used to remove charge from charged foreign matter adhering to the semiconductor chip 20.

Figure 6:
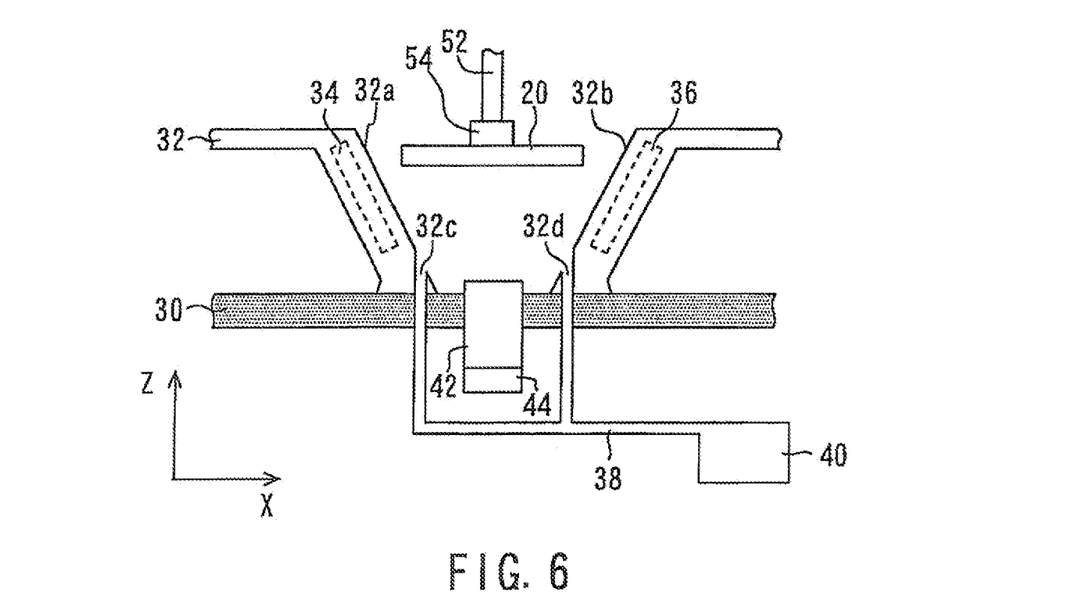
FIG. 6 is an elevational view of the foreign matter removal unit after the semiconductor chip has been moved.

The transfer unit 18 with the semiconductor chip 20 held thereto by suction is then moved so that the semiconductor chip 20 is moved to a position above the first slope 32a and the second slope 32b. FIG. 6 is an elevational view of the foreign matter removal unit 14 after the semiconductor chip 20 has been moved to a position above the first slope 32a and the second slope 32b. Specifically, the semiconductor chip 20 is positioned between and above the first slope 32a and the second slope 32b.

Figure 7:
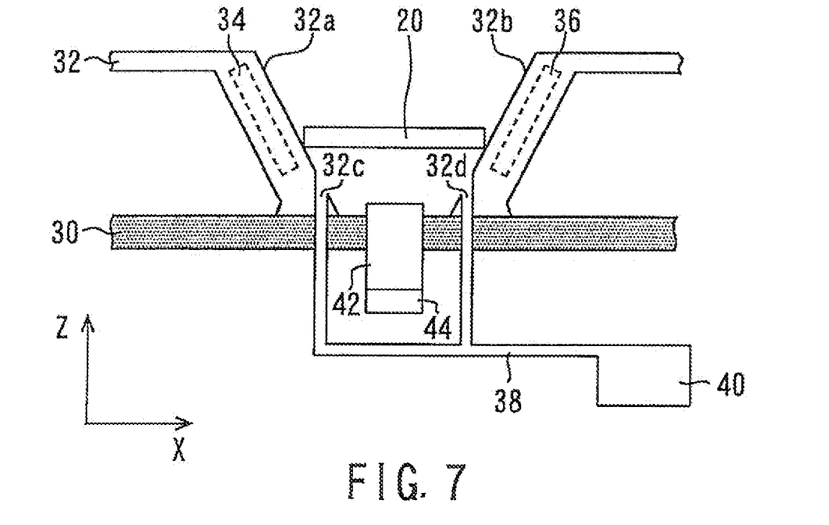
FIG. 7 shows a drop of semiconductor chip by its own weight.

Next, the suction device 56 stops drawing air from inside the suction member 52 so that the semiconductor chip 20 is no longer held to the collet 54 by vacuum. As a result, the semiconductor chip 20 drops downward by its own weight, so that a first pair of opposing sides of the rectangular semiconductor chip 20 respectively come into contact with the first slope 32a and the second slope 32b, as shown in FIG. 7.

Since the first slope 32a and the second slope 32b are provided with an abrasive coating or adhesive sheet, foreign matter present on the first pair of opposing sides of the semiconductor chip 20 is removed by the abrasive coating or adhesive sheet. Specifically, particles of the abrasive coating catch on the foreign matter and apply tensile stress to it, resulting in removal of the foreign matter from the semiconductor chip 20. In the case of the adhesive sheet, foreign matter adheres to it and is thereby removed from the semiconductor chip 20.

Further, the vibrators 34 and 36 are operated to vibrate the first slope 32a and the second slope 32b so that the abrasive coating or adhesive sheet comes into full contact with foreign matter, thus promoting the removal of foreign matter from the semiconductor chip 20. Further, the suction device 40 is operated to draw air from the openings 32c and 32d and thereby collect foreign matter which has been removed from the semiconductor chip 20. This prevents the foreign matter from re-adhering to the semiconductor chip 20.

Figure 8:
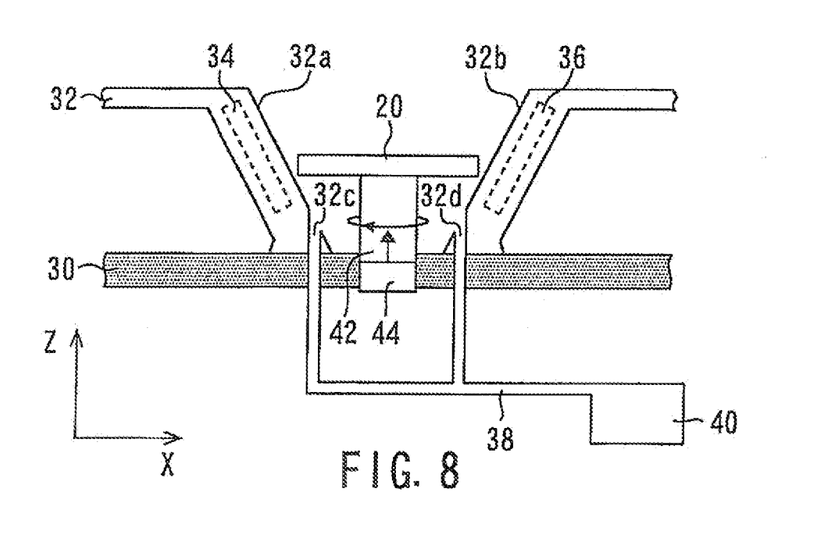
FIG. 8 is an elevational view of the foreign matter removal unit after the semiconductor chip has been held on the lifting member.

Next, the lifting member 42 is moved upward (i.e., in the positive Z-axis direction) using the movement control unit 44 so that the semiconductor chip 20 is held on the lifting member 42. FIG. 8 is an elevational view of the foreign matter removal unit 14 after the semiconductor chip 20 has been held on the lifting member 42. Thus the semiconductor chip 20 is separated from the first slope 32a and the second slope 32b. In this state, the lifting member 42 is rotated 90 degrees about its Z-axis using the movement control unit 44. The lifting member 42 is then moved downward (i.e., in the negative Z-axis direction) so that the remaining pair of opposing sides of the semiconductor chip 20, which were not previously in contact with the first slope 32a and the second slope 32b, are in contact with these slopes.

In this state, the vibrators 34 and 36 and the suction device 40 are operated to remove foreign matter from the remaining pair of opposing sides of the semiconductor chip 20. Thus, this step removes foreign matter from the four sides of the semiconductor chip 20 and is referred to herein as the foreign matter removal step.

After the completion of the foreign matter removal step, the lifting member 42 is moved upward again so that the semiconductor chip 20 is held on the lifting member 42. Subsequently, the semiconductor chip 20 is held to the collet 54 of the transfer unit 18 by suction and transferred to the test unit 16. The semiconductor chip 20 is then tested for electrical characteristics by the test unit 16. This step is referred to herein as the test step. After the completion of the test step, the semiconductor chip 20 is transferred out of the test apparatus 10, completing the test method.

It should be noted that dicing a semiconductor wafer results in a large amount of scraps, chippings, and the like of semiconductor wafer material being cut from the sides of the individual semiconductor chips. These scraps, chippings, and the like are referred to herein as foreign matter, and such foreign matter adheres around the sides of each semiconductor chip. This kind of foreign matter is referred to herein as adhering foreign matter.

Further, dicing a semiconductor wafer sometimes results in the situation where a portion of the metal electrodes on the wafer, which electrodes serve as the top and bottom surface electrodes of the individual semiconductor chips, is peeled and remains hanging from a semiconductor chip. Such a peeled electrode portion may be referred to herein as hanging foreign matter. This kind of hanging foreign matter extends from a side of a semiconductor chip.

Further, foreign matter which has been charged during the manufacturing process of a semiconductor wafer sometimes adheres around the sides of the semiconductor chips. This kind of foreign matter is referred to herein as process foreign matter. If a semiconductor chip having any one of adhering foreign matter, hanging foreign matter, and process foreign matter is tested, the test results will be affected by the foreign matter, or the semiconductor chip might be damaged by the foreign matter. Therefore, it is necessary to remove these kinds of foreign matter (if any) from a semiconductor chip before testing its characteristics.

In the foreign matter removal step of the test method of the first embodiment, foreign matter is removed from the sides of the semiconductor chip. Specifically, in that step, sides of the semiconductor chip are brought into contact with the first slope 32a and the second slope 32b of the foreign matter removal unit 14 to remove adhering foreign matter and hanging foreign matter from these sides. At that time the first slope 32a and the second slope 32b are vibrated by the vibrators 34 and 36, thereby promoting the removal of the foreign matter.

Further in the test method of the first embodiment, the charge removal devices 58 and 60 may be used to remove charge, primarily from process foreign matter, since it is difficult to remove charged foreign matter. That is, foreign matter (process foreign matter) can be easily removed after removing charge (if any) from it using the charge removal devices 58 and 60. For example, uncharged process foreign matter can be readily removed by applying vibrations to it using the vibrators 34 and 36.

Thus, in the test method of the first embodiment, the test step is performed after removing foreign matter from the semiconductor chip in the foreign matter removal step, resulting in enhanced reliability of the test. Furthermore, the foreign matter removal unit 14 has a very simple structure, thereby facilitating the removal of foreign matter.

The transfer unit 18 may have any structure that enables the semiconductor chip 20 to be held and released above the first slope 32a and the second slope 32b and transferred to the test unit 16. For example, if the amount of process foreign matter is negligible, then the charge removal devices 58 and 60 may be omitted from the transfer unit 18.

The removal of charge from foreign matter may be done during the foreign matter removal step instead of before the foreign matter removal step. In order to promote the removal of foreign matter, an ultrasonic wave may be applied to the semiconductor chip 20 before or during the foreign matter removal step. The application of ultrasonic vibration to foreign matter adhering to the semiconductor chip results in decreased adhesion of the foreign matter. The ultrasonic application device for generating the ultrasonic vibration may be secured, e.g., to the transfer unit.

The first slope 32a and the second slope 32b may be provided with an abrasive-coated sheet of the take-up type. Alternatively, the first slope 32a and the second slope 32b may be provided with an adhesive sheet of the take-up type. The use of an abrasive sheet or adhesive sheet which can be taken up facilitates the replacement of a used dirty sheet (or surface) with a clean sheet (or surface). For example, each time a semiconductor chip has been processed in the foreign matter removal unit 14, the abrasive sheet (or adhesive sheet) may be taken up to make a clean abrasive surface (or a clean adhesive surface) available. This prevents foreign matter which has been removed from one semiconductor chip from adhering to other semiconductor chips.

The foreign matter removal unit 14 may be provided with a recess for storing foreign matter which has dropped from the semiconductor chip 20. This eliminates the need for the pipe 38 and the suction device 40. Although in the above example the first slope 32a and the second slope 32b are vibrated by the vibrators 34 and 36 in the foreign matter removal step, it is to be understood that if the vibration of these slopes is not required, then the vibrators 34 and 36 may be omitted from the foreign matter removal unit 14.

In addition to the first slope 32a and the second slope 32b, the foreign matter removal unit 14 may have a third slope and a fourth slope which are configured and positioned such that they receive and contact different sides of the semiconductor device 20 than those received and contacted by the first and second slopes. That is, each of the first to fourth slopes receives and contacts a different one of the four sides of the semiconductor chip, thereby speeding up the removal of foreign matter from the semiconductor chip. It should be noted that these alterations may also be made to the test apparatuses and the test methods in accordance with the subsequently described embodiments.

Second Embodiment

Figure 9:
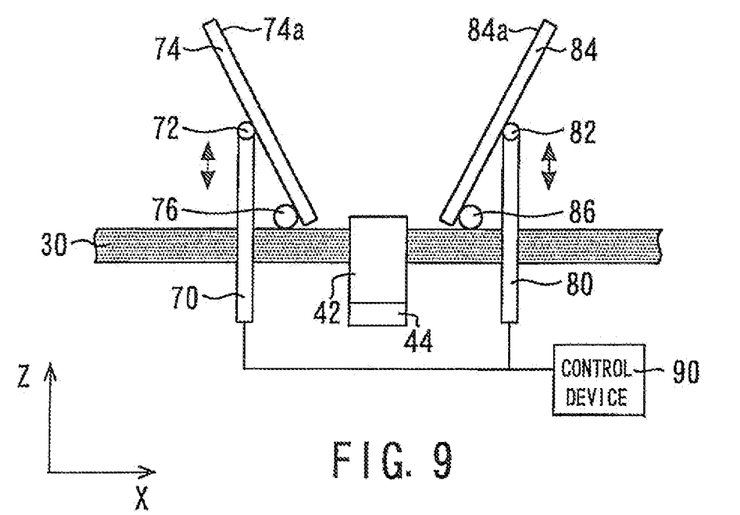
FIG. 9 is an elevational view of a foreign matter removal unit of the second embodiment.

A second embodiment of the present invention provides a test apparatus and a test method which have many features common to the test apparatus and the test method of the first embodiment. Therefore, the following description of the second embodiment will be primarily limited to the differences from the first embodiment. FIG. 9 is an elevational view of a foreign matter removal unit of the second embodiment. This foreign matter removal unit has bar-like members 70 and 80 which can be moved through the substrate 30 in the Z-direction. The movement of the bar-like members 70 and 80 is controlled by a control device 90.

A body member 74 is connected through a rotational shaft 72 to the tip of the bar-like member 70. The body member 74 has a first slope 74a provided with an abrasive coating or an adhesive sheet. The tip of the body member 74 is provided with a roller 76 which can be rolled in the X-direction. The body member 74 is mounted on the substrate 30 with the roller 76 interposed therebetween. Moving the bar-like member 70 in the Z-direction rotates the body member 74 about the axis of the rotational shaft 72 and thereby changes the angle of the first slope 74a with respect to the substrate 30.

A body member 84 is connected through a rotational shaft 82 to the tip of the bar-like member 80. The body member 84 has a second slope 84a provided with an abrasive coating or an adhesive sheet. The tip of the body member 84 is provided with a roller 86 which can be rolled in the X-direction. The body member 84 is mounted on the substrate 30 with the roller 86 interposed therebetween. Moving the bar-like member 80 in the Z-direction rotates the body member 84 about the axis of the rotational shaft 82 and thereby changes the angle of the second slope 84a with respect to the substrate 30.

Thus, the foreign matter removal unit of the second embodiment has the bar-like members 70 and 80, the rotational shafts 72 and 82, the rollers 76 and 86, and the control device 90 which together serve as an angle changing mechanism for changing the angles of the first slope 74a and the second slope 84a with respect to the substrate 30.

Figure 10:
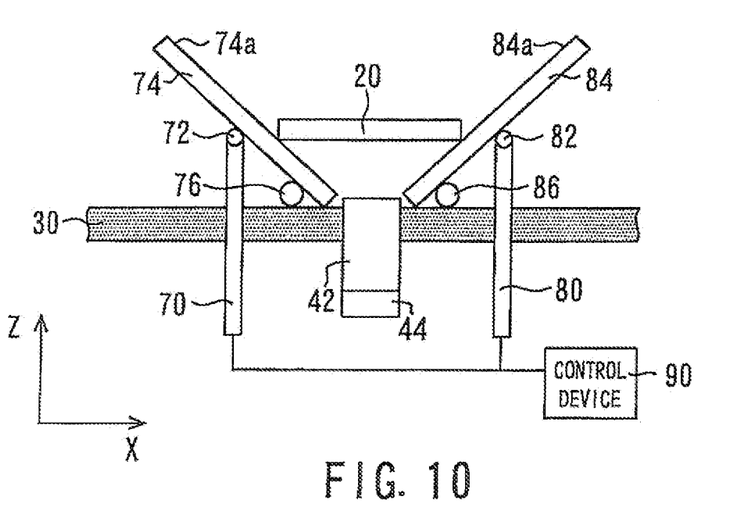
FIG. 10 is an elevational view of the foreign matter removal unit immediately after the semiconductor chip have come into contact with the first and second slopes.

The following description will be directed to the foreign matter removal step of the test method of the second embodiment. It should be noted that prior to the foreign matter removal step, the semiconductor chip 20 is held to the collet 54 by vacuum and transferred to a position above the first slope 74a and the second slope 84a. In the subsequent foreign matter removal step, first, the production of vacuum is stopped to release the semiconductor chip 20 from the collet 54. As a result, the semiconductor chip 20 drops downward by its own weight, so that a first pair of opposing sides of the rectangular semiconductor chip 20 respectively come into contact with the first slope 74a and the second slope 84a, which face each other. FIG. 10 is an elevational view of the foreign matter removal unit immediately after the first pair of opposing sides of the semiconductor chip 20 have come into contact with the first and second slopes.

Figure 11:
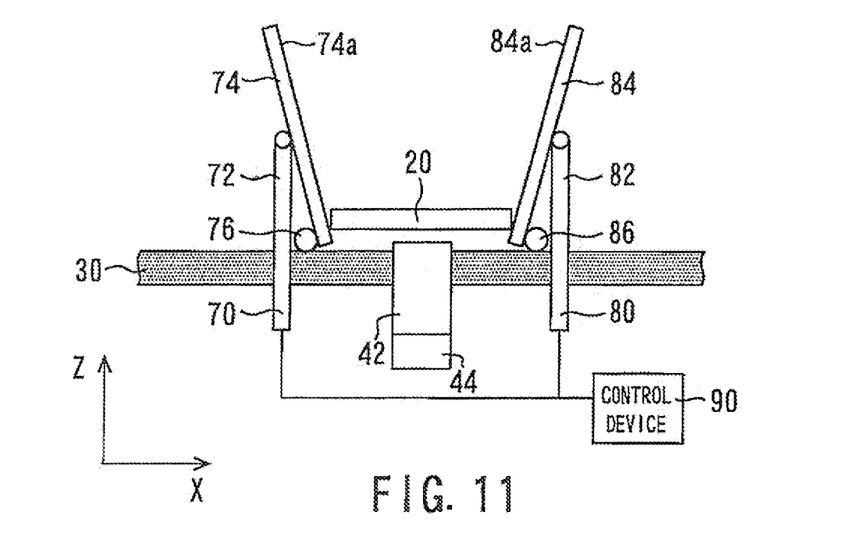
FIG. 11 shows that the bar-like members are moved upward.

Next, the bar-like members 70 and 80 are moved upward (i.e., in the positive Z-axis direction) using the control device 90, as shown in FIG. 11, so that the lower portions of the first slope 74a and the second slope 84a below the rotational shafts 72 and 82, respectively, are spaced from each other a greater distance than before. As a result, the semiconductor chip 20 slides downward along the first slope 74a and the second slope 84a by its own weight. At that time, the first pair of opposing sides of the semiconductor chip 20, which are in contact with the slopes, experience friction. This friction serves to remove foreign matter from those opposing sides of the semiconductor chip 20. After the completion of removal of foreign matter from the first pair of opposing sides of the semiconductor chip 20, the semiconductor chip 20 is raised and rotated and then foreign matter is removed from the remaining pair of opposing sides of the semiconductor chip 20 in a manner similar to that described above in connection with the first pair of opposing sides of the semiconductor chip 20, thereby completing the foreign matter removal step.

As described above, in the foreign matter removal step of the second embodiment, the distance between the first slope 74a and the second slope 84a is varied so that the semiconductor chip 20 slides downward along these slopes, with a pair of opposing sides of the semiconductor chip 20 being in sliding contact with the slopes. As a result, foreign matter on those opposing sides of the semiconductor chip 20 is removed by the abrasive coating or adhesive sheet on the slopes, thereby promoting the removal of foreign matter from the sides of the semiconductor chip 20.

The configuration of the angle changing mechanism is not limited to that described above, and the angle changing mechanism may have any configuration that enables varying the angles of the first slope 74a and the second slope 84a with respect to the substrate 30. The test method of the second embodiment may include the steps of vibrating the slopes to promote the removal of foreign matter from the semiconductor chip, applying ultrasonic vibration to the semiconductor chip to promote the removal of foreign matter from it, and/or removing charge from foreign matter. Further, the body members 74 and 84 may have formed therein an opening for collecting foreign matter.

Third Embodiment

A third embodiment of the present invention provides a test apparatus and a test method which have many features common to the test apparatus and the test method of the first embodiment. Therefore, the following description of the third embodiment will be primarily limited to the differences from the first embodiment. The test apparatus and the test method of the third embodiment are used to remove foreign matter from the upper and lower surfaces of a semiconductor chip as well as from the sides thereof.

Figure 12:
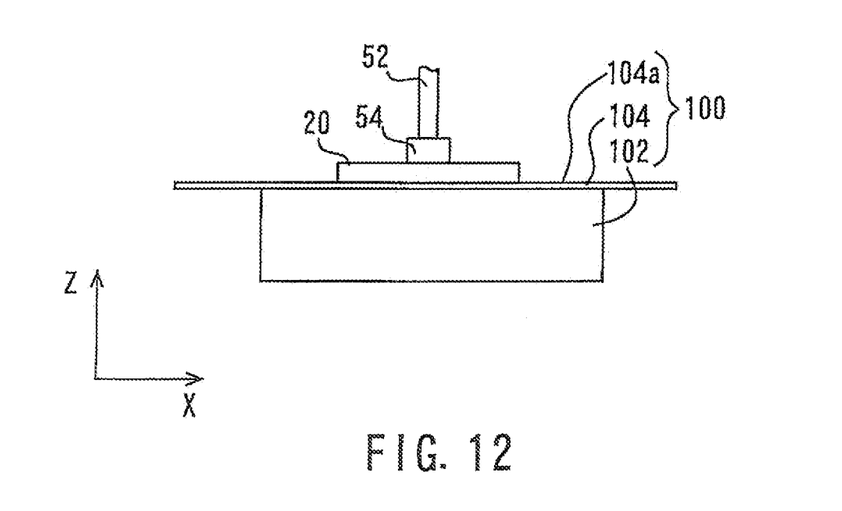
FIG. 12 is an elevational view of an additional foreign matter removal unit of the third embodiment.

FIG. 12 is an elevational view of an additional foreign matter removal unit 100, etc. of the third embodiment. The additional foreign matter removal unit 100 includes a substrate 102 and an abrasive sheet 104 provided on the substrate 102. The abrasive sheet 104 has a flat top surface 104a. It should be noted that the abrasive sheet 104 may be replaced by an adhesive sheet.

The following description will be directed to an additional foreign matter removal step of the third embodiment in which foreign matter is removed from a semiconductor chip 20 by the additional foreign matter removal unit 100. First, the transfer unit 18 holds the semiconductor chip 20 to the collet 54 and transfers the chip to the additional foreign matter removal unit 100. The collet 54 with the semiconductor chip 20 thereon is then moved so that the lower surface of the semiconductor chip 20 is brought into contact with the flat surface 104a of the abrasive sheet 104, thereby removing foreign matter from the lower surface of the semiconductor chip 20.

Next, the orientation of the semiconductor chip 20 held to the collet 54 is changed so that the upper surface of the semiconductor chip 20 faces the abrasive sheet 104, and then the upper surface of the semiconductor chip 20 is brought into contact with the flat surface 104a of the abrasive sheet 104, thereby removing foreign matter from the upper surface. Subsequently, the semiconductor chip 20 is transferred to the test unit 16 by the transfer unit 18. It should be noted that this additional foreign matter removal step is performed before the test step.

Thus, in the third embodiment, foreign matter present on the upper and lower surfaces of the semiconductor chip 20 is removed in the additional foreign matter removal step while foreign matter present on the sides of the semiconductor chip 20 is removed in the foreign matter removal step. This means that foreign matter is removed from all surfaces of the semiconductor chip 20, resulting in enhanced reliability of the test.

The transfer unit 18 or the additional foreign matter removal unit 100 may be provided with a pressurizing mechanism to tightly press the semiconductor chip 20 against the flat surface 104a of the abrasive sheet 104. The pressurizing mechanism provided to the transfer unit 18 may be, e.g., a spring capable of expansion and contraction in the Z-direction.

In the additional foreign matter removal step, the semiconductor chip 20 or the flat surface 104a of the abrasive sheet 14 may be vibrated to promote the removal of foreign matter from the semiconductor chip 20. Further, charge may be removed from foreign matter on the semiconductor chip 20, and/or an ultrasonic wave may be applied to the semiconductor chip, before or during the additional foreign matter removal step. Further, a take-up abrasive sheet or a take-up adhesive sheet may be used.

Further, when the semiconductor chip 20 is in contact with the flat surface 104a of the abrasive sheet 104, the abrasive sheet 104 may be moved in a direction perpendicular to the Z-axis direction. For example, the abrasive sheet 104 may be of the take-up type and may be taken up after the semiconductor chip 20 has been brought into contact with the flat surface 104a. The resulting friction applied to foreign matter on the semiconductor chip 20 serves to remove the foreign matter.

Features of the test apparatuses and the test methods of the first to third embodiments may be combined where appropriate.

Thus the present invention enables a semiconductor chip to be reliably tested by removing foreign matter from the chip beforehand using a simple method.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2013-165108, filed on Aug. 8, 2013 including specification, claims, drawings and summary, on which the Convention priority of the present application is based, is incorporated herein by reference in its entirety.

What is claimed is:

1. A test apparatus comprising:
    a foreign matter removal unit having a first slope provided with an abrasive coating or an adhesive sheet and a second slope provided with an abrasive coating or an adhesive sheet, said second slope facing said first slope in such a manner that an upper end of said second slope is spaced from an upper end of said first slope a greater distance than a lower end of said second slope is spaced from a lower end of said first slope;
    a test unit for testing electrical characteristics of a semiconductor chip; and
    a transfer unit for holding and releasing said semiconductor chip at a position above said first and second slopes and transferring said semiconductor chip to said test unit.

2. The test apparatus according to claim 1, wherein said foreign matter removal unit includes a body member having said first and second slopes formed thereon, a substrate on which said body member is mounted, and an angle changing mechanism for changing angles of said first and second slopes with respect to said substrate.

3. The test apparatus according to claim 1, further comprising a vibrator for vibrating said first and second slopes.

4. The test apparatus according to claim 1, further comprising an ultrasonic application device for applying an ultrasonic wave to said semiconductor chip.

5. The test apparatus according to claim 1, wherein said first and second slopes are provided with a take-up abrasive sheet having an abrasive coating adhering thereto.

6. The test apparatus according to claim 1, wherein said first and second slopes are provided with a take-up adhesive sheet.

7. The test apparatus according to claim 1, wherein said foreign matter removal unit is provided with a recess for storing foreign matter which has dropped from said semiconductor chip.

8. The test apparatus according to claim 1, further comprising an additional foreign matter removal unit having a flat surface provided with an abrasive coating or an adhesive sheet.

9. The test apparatus according to claim 1, further comprising a charge removal device for removing charge from foreign matter on said semiconductor chip.

10. The test apparatus according to claim 9, wherein said charge removal device is an ionizer.

11. The test apparatus according to claim 1, further comprising a lifting member moved vertically through a space between said first and second slopes.

12. The test apparatus according to claim 11, further comprising a movement control unit for rotating said lifting member.

13. The test apparatus according to claim 1, wherein said first and second slopes have formed therein an opening for collecting foreign matter which has dropped from said semiconductor chip.

14. The test apparatus according to claim 13, further comprising a suction device for drawing air from inside said opening.

15. A test method comprising:
    removing foreign matter from sides of a diced semiconductor chip by bringing said sides of said semiconductor chip into contact with slopes having an abrasive coating or an adhesive sheet thereon; and
    testing electrical characteristics of said semiconductor chip after said foreign matter removal step.

16. The test method according to claim 15, wherein:
    said slopes include a first slope and a second slope facing said first slope; and
    in said foreign matter removal step, said sides of said semiconductor chip are brought into contact with said first and second slopes, and distance between said first and second slopes is varied so that said semiconductor chip slides along said first and second slopes.

17. The test method according to claim 15, wherein in said foreign matter removal step, said slopes are vibrated.

18. The test method according to claim 15, wherein before or during said foreign matter removal step, charge is removed from foreign matter adhering to said semiconductor chip.

19. The test method according to claim 15, wherein before or during said foreign matter removal step, an ultrasonic wave is applied to said semiconductor chip.

20. The test method according to claim 15, further comprising, before said test step, removing foreign matter from an upper surface and a lower surface of said semiconductor chip by bringing said upper and lower surfaces of said semiconductor chip into contact with flat surfaces having an abrasive coating or an adhesive sheet thereon.

* * * * *